US006991711B2

(12) United States Patent
Sakaki

(10) Patent No.: US 6,991,711 B2
(45) Date of Patent: Jan. 31, 2006

(54) CUP TYPE PLATING APPARATUS

(75) Inventor: Yasuhiko Sakaki, Hiratsuka (JP)

(73) Assignee: Electroplating Engineers of Japan Limited, Tokyo (JP)

(*) Notice: Subject to any disclaimer, the term of this patent is extended or adjusted under 35 U.S.C. 154(b) by 507 days.

(21) Appl. No.: 10/087,845

(22) Filed: Mar. 5, 2002

(65) Prior Publication Data
US 2002/0088708 A1 Jul. 11, 2002

Related U.S. Application Data

(62) Division of application No. 09/516,788, filed on Mar. 1, 2000, now Pat. No. 6,454,918.

(30) Foreign Application Priority Data

| Mar. 23, 1999 | (JP) | 1999-078564 |
| Jul. 19, 1999 | (JP) | 1999-205234 |
| Aug. 25, 1999 | (JP) | 1999-237868 |

(51) Int. Cl.
C25D 7/12 (2006.01)
C25D 21/10 (2006.01)
C25D 5/08 (2006.01)

(52) U.S. Cl. .................................. 204/273
(58) Field of Classification Search ............ 204/273; 205/148
See application file for complete search history.

(56) References Cited

U.S. PATENT DOCUMENTS

| 1,084,210 | A | * | 1/1914 | Howard | 366/302 |
| 3,652,442 | A | * | 3/1972 | Powers et al. | 204/273 |
| 4,102,756 | A | * | 7/1978 | Castellani et al. | 205/82 |
| 4,696,729 | A | * | 9/1987 | Santini | 204/224 R |
| 4,806,224 | A | * | 2/1989 | Bruun et al. | 205/770 |
| 5,182,009 | A | * | 1/1993 | Matumoto | 205/238 |
| 5,217,598 | A | * | 6/1993 | Sawa et al. | 205/148 |
| 5,683,564 | A | * | 11/1997 | Reynolds | 205/68 |
| 6,099,712 | A | | 8/2000 | Ritzdorf et al. | 205/123 |
| 6,251,250 | B1 | * | 6/2001 | Keigler | 205/89 |
| 6,280,582 | B1 | | 8/2001 | Woodruff et al. | 204/242 |
| 6,280,583 | B1 | | 8/2001 | Woodruff et al. | 204/242 |
| 6,672,318 | B1 | * | 1/2004 | Tsuchiya et al. | 134/147 |

FOREIGN PATENT DOCUMENTS

JP 05-175158 A * 7/1993

* cited by examiner

Primary Examiner—Roy King
Assistant Examiner—Harry D. Wilkins, III
(74) Attorney, Agent, or Firm—Rothwell, Figg, Ernst & Manbeck

(57) ABSTRACT

A cup type plating apparatus in which plating is carried out by supplying plating solution to a wafer placed on an opening at a top of a plating tank while an anode and the wafer connected to a cathode provided in the plating tank are electrically connected, and the anode and the cathode are separated by diaphragm provided in the plating tank, provided with a division wall between the anode and the wafer formed in a shape capable of separating the anode and the wafer from each other and having a plurality of openings covered with diaphragm. The concentration of the plating solution supplied to the plating tank separated by the division wall is made to be appropriately controllable. Further, a unit for stirring is provided capable of forcibly altering the flow of plating solution at the target surface of plating.

4 Claims, 4 Drawing Sheets

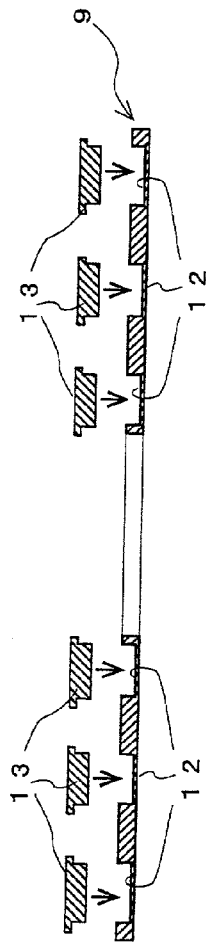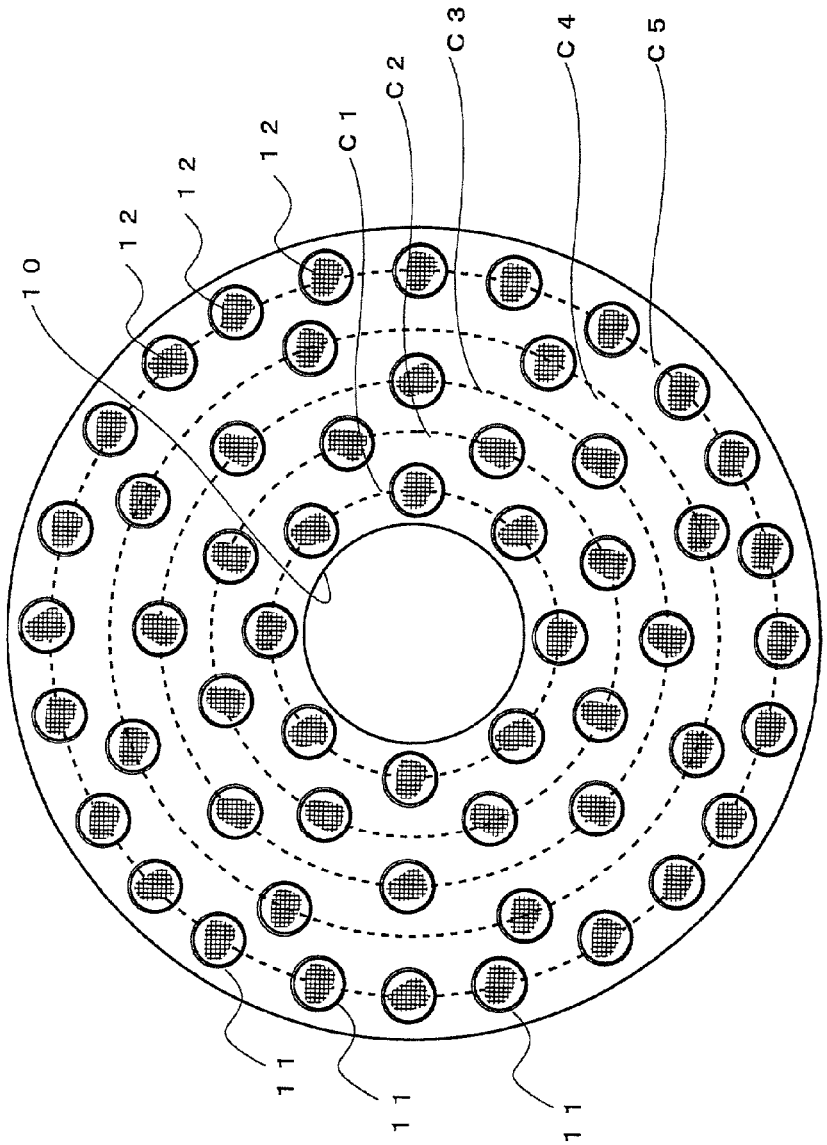
FIG. 2
FIG. 3

CUP TYPE PLATING APPARATUS

This applicaton is a division of application Ser. No. 09/516,788, filed Mar. 1, 2000, now U.S. Pat. No. 6,454,918.

BACKGROUND OF THE INVENTION

1. Field of the Invention

The present invention relates to an apparatus for plating wafers for semiconductors, and particularly relates to a cup type plating apparatus.

2. Description of the Prior Art

As an apparatus for plating wafers for semiconductors, a cup type plating apparatus is known. Generally, this cup type plating apparatus, in which wafers are plated by mounting them at the opening of a plating tank, supplying a plating solution through a tube fixed at the bottom center of the plating tank for supplying solutions, and electrically connecting an anode provided in the plating tank and wafers connected to a cathode, has become widely used because of the suitability for production in small lots and automation of plating steps are possible.

However, this cup type plating apparatus also has some points to be improved. For example, when plating is carried out, films such as black film are formed on the surface of the anode which may come off, go into the plating solution as impurities, and reach surfaces of the wafers to be plated, causing unevenness in the quality of plating.

Also, when an insoluble anode is used in the plating apparatus, control of the quality of plating may become difficult due to decomposition of additives around the insoluble anode instead of dissolution of the anode metal, causing problems in management and cost.

Taking these points in consideration, a technology of providing a conductive diaphragm in the plating tank to separate the anode and the wafer from each other have been proposed as shown in Japanese Utility Model Application Laid-Open No. 62-36529, Japanese Patent Application Laid-Open 1-242797, Japanese Patent No. 2908790. This technology is excellent in that the diaphragm separating plating solutions of the anode side and of the wafer side prevents them from mixing, thereby preventing impurities from contacting the wafer and further the whole plating solution from being deteriorated.

incidentally, the diaphragm to be used in this case is required to have an area roughly corresponding to the cross sectional area of the plating tank for the purpose of separating the anode and the wafer from each other. However, it is considerably difficult to put diaphragms to practical use, though there are many advantages, as there are technical difficulties in the production of diaphragms with large area as the production cost of these diaphragms with increased area increases with respect to increases in geometrical ratio.

The cup type plating apparatus having a diaphragm is often formed by separating a wafer side separate chamber above the diaphragm and an anode side separate chamber below the diaphragm, both separate chambers being provided with circulation tubes for charging and discharging the plating solution so that plating solution of each separate chamber can be circulated. Here in this specification, the route for charging the plating solution into and discharging it from the cathode side separate chamber is defined as the main plating solution circulation route, and the route for charging the plating solution into and discharging it from the anode side separate chamber is defined as the auxiliary plating solution circulation route.

The purpose of providing such separate plating solution circulation routes is to prevent impurities, such as those formed from black films formed on and removed from the anode or formed in the plating solution by decomposition of additives, from getting into the plating solution to be charged into the wafer side separate chamber. Therefore, a cup type plating apparatus provided with a diaphragm can significantly reduce defective plating in plating of wafers where uniform and accurate plating quality are required.

However, plating using this cup type plating apparatus with a diaphragm may cause such undesirable situations as follows. For example, in case of plating wafers with Cu using a cupric sulfate plating solution and a soluble Cu anode, Cu concentration of the plating solution in the anode side separate chamber increases, causing imbalance of Cu concentration between plating solutions in the wafer side and the anode side of separate chambers. Although a small amount of the plating solution of the anode side separate chamber infiltrates into the cathode side separate chamber forced by the osmotic pressure, increase of Cu concentration through dissolution of the Cu anode material proceeds much faster, resulting in significant difference in Cu concentration between the anode and the cathode side separate chambers. Once this phenomenon occurs, plating current efficiency is reduced accompanied by change in quality of plating, also causing the problem that stable plating becomes impossible.

Further, the conventionally used cup type plating apparatus has an advantage of being capable of uniformly plating all over target surfaces of plating, since the plating solution is supplied as upward flow against the target surface of plating of the mounted wafer so that the plating solution contacts the plating target surface as a flow spreading from the center toward the edge.

However, as slight bump is formed resulting in an edge between the solution outlet provided beneath the mounted wafer and the target surface of plating of the wafer in this cup type plating apparatus, there occurs a phenomenon in which flow of the plating solution stagnates around the edge resulting in non-uniform plating in the periphery of the target surface of plating. This phenomenon causes undesirable yield because usable area of wafers is restricted, so that technologies capable of widening usable area of wafers is required.

Accompanying the current progress of fine wiring processing technology, very fine processing has become available for circuit patterns provided on the surface of wafers, and technologies of more homogeneous plating has become required for wafer surfaces provided with such fine wiring processing as the target surfaces of plating.

Conventional cup type plating apparatus has not been so sufficient for these requests in more uniformly plating the whole target surface provided with fine wiring since the flowing condition of the plating solution constantly forms a flow spreading from the center towards the peripheral directions. Also there was limitation in uniformly plating larger area extending to peripheries of the plating target area of the wafers.

SUMMARY OF THE INVENTION

The present invention was completed with such a background as described above, and provides a technology capable of plating wafers more homogeneously than before when plating them by using a cup type plating apparatus. Particularly, the present invention enables use of a diaphragm for the cup type plating apparatus without any problem of cost required for the diaphragm, provides a cup type plating apparatus that can respond to variation of the concentration of plating solutions to allow plating at stably maintained concentrations of the solutions, even when separate plating solutions are circulated in the anode side and wafer side separate chambers formed in a plating tank by separation with a diaphragm, and further provides a cup type plating apparatus that avoids nonuniformity at the periphery of the target surface of plating due to the flowing condition of the plating solution in a conventional cup type plating apparatus, and enables more homogeneous plating all over the target surface of plating.

In the present invention, in order to solve the aforementioned problems, a wafer is plated by supplying a plating solution through a solution supply tube provided at a center bottom of a plating tank to the wafer placed at an opening at the top of a plating tank, while electrically connecting the anode provided in the plating tank and the wafer connected to the cathode, and in a cup type plating apparatus having a diaphragm for separating an anode and a wafer, a division wall having a plurality of openings covered with diaphragms is provided between an anode and a wafer so that they can be separated from each other.

This technology utilizes a division wall having a plurality of openings covered with diaphragms in place of the single diaphragm in the prior art. Therefore, the present invention can realize plating in good conditions using a diaphragm without technological and cost problems, because a diaphragm of large area is not required.

The division wall is satisfactory if shaped capable of separating an anode and a wafer from each other, and any other particular limitations in shape are not required. A receptacle to which a liquid-supply tube is inserted may be provided in the center of the division wall if it is necessary to maintain liquid flow when the plating solution is supplied from the liquid-supply tube to the target surface of a wafer. Also, the openings covered by diaphragm may be provided at equal intervals on a plurality of circles concentric with the opening for the liquid-supply tube, if it is necessary to secure uniform plating current distribution and plating solution supply.

Here it is possible and preferable that the cup type plating apparatus according to the present invention is provided with non-conductive caps which are formed to fit in and detachable from the openings. When plating in a cup type plating apparatus, uneven plating may occur due to the property of the cathode to be connected to the wafer and nonuniform flow of the plating solution supplied as an upward flow. Of course it is possible in such cases to adjust the cathode or the flow of plating solution to reduce uneven plating, however such an operation is troublesome. Here, uneven plating will be avoided without troublesome procedures by using non-conductive caps capable of closing the openings provided in the division wall to be fixed in the optional ones of the openings, since current density in the cross sectional direction of the plating tank can be varied at will. When a constitution with openings made at equal intervals on a plurality of circles concentric with the liquid-supply tube receptacle is adopted, uneven plating will be further avoided, since not only uniform current density becomes easily obtainable, but also variation of current density at every part becomes easily calculable, and as a result optional variation of current density at every part becomes easily effected.

The division wall according to the present invention is preferably formed flat because three dimensional cutting of diaphragms becomes unnecessary, and processing of the diaphragm becomes easier. Incidentally, when such a flat division wall is adopted, gases evolved from the anode tend to stay right below the division wall. Existence of gases is undesirable as they influence the current density. In order to solve such a problem, a vent port may be provided right beneath the division wall in the plating tank to release the gases evolved from the anode. More precise control of current density will thus become possible.

Further, a cup type plating tank according to the present invention is preferably provided with separate liquid circulation channels in order to avoid mixing the liquid supplied to the anode side of the plating tank separated by a division wall with the liquid supplied to the wafer. By doing so, since the liquid supplied to the wafer, namely the plating solution, does not directly contact the anode, additives in the plating solution will not be decomposed by the anode, and adjustment of the plating solution due to consumption of additives will become easier. Also, as impurities such as the black film formed by the anode do not go into the plating solution supplied to the wafer, management of the plating solution will become easier.

The division wall explained above may be applied to a cup type plating apparatus as described above, namely any cup type plating apparatus in which a wafer is plated by supplying a plating solution through a solution-supply tube provided at the center bottom of the plating tank to the wafer placed at the opening at the top of a plating tank, while electrically connecting the anode provided in the plating tank and the wafer connected to the cathode. Thus, the division wall according to the present invention, formed to be able to separate an anode and a wafer from each other and having a plurality of openings covered with a diaphragm, is highly advantageous, because it can be used by adding to a conventional cup type plating apparatus without changing specifications of the plating tank, and therefore a simple cup type plating apparatus can be reformed to one utilizing a diaphragm.

The present invention contemplates a solution to the problem of variation in the concentration of plating solution when a plating tank is provided with a diaphragm. Specifically, in a cup type plating apparatus in which a wafer is plated by supplying a plating solution through a solution-supply tube provided at the center bottom of the plating tank to the wafer placed at the opening at the top of a plating tank, while electrically connecting the anode provided in the plating tank and the wafer connected to the cathode, provided with a diaphragm in the plating tank to separate the anode and the wafer from each other and to form a wafer-side separate chamber and an anode-side separate chamber above and below the diaphragm respectively, and separately provided with a main plating solution circulation channel for charging plating solution to and discharging plating solution from the wafer-side separate chamber and an auxiliary plating solution circulating channel for charging plating solution to and discharging plating solution from the anode side separate chamber, a main plating solution reservoir for holding the plating solution of the main plating solution channel, an auxiliary plating solution reservoir for holding the plating solution of the auxiliary plating solution circulating channel, and means for mutually sending the plating solutions held in the main and the auxiliary plating solution reservoirs respectively are also provided.

In this cup type plating apparatus, plating solutions of roughly the same concentration can be supplied to the anode-side and the cathode-side separate chambers even when the concentration of the plating solution in the anode side separate chamber is varied due to dissolution of the anode, as the plating solutions in the main and the auxiliary plating solution reservoirs can be mixed with each other. Also, when the concentration of the auxiliary plating solution increased due to dissolution of the anode, the auxiliary plating solution with increased concentration can be sent to the main plating solution reservoir to supply the metal ions for plating the main plating solution, or inversely the main plating solution can be sent to the auxiliary plating solution reservoir to reduce the concentration of the auxiliary plating solution. Thus, the concentration of the plating solutions in both reservoirs can be adjusted at will, enabling more efficient use of the plating solution.

This means for mutually sending liquid to the main and the auxiliary plating solution reservoirs is preferably provided with means for filtration such as a filter. Thus, impurities such as black film formed on and removed from the anode and products of decomposition of the additives in the plating solution by the anode can be removed from the plating solutions in the auxiliary and the main plating solution reservoirs.

Further, means for detecting concentration of the plating solution are preferably provided to the main and the auxiliary plating solution reservoirs to control the concentration of the plating solutions in both the reservoirs so that the plating solutions in the main and the auxiliary plating solution reservoirs may be adjusted. This enables control of the plating solutions in both the reservoirs in respective fixed ranges, and stable continuous plating for a long time.

The cup type plating apparatus according to the present invention described above can be used not only when soluble anodes are used, but also when insoluble anodes are used. When an insoluble anode is used and the main and the auxiliary plating solutions with different compositions are supplied, it is essential that that these solutions are not mixed. This case of using an insoluble anode can be covered by not using means for sending liquid provided to both the reservoirs according to the present invention.

More over, in order to prevent uneven plating in the periphery of the target surface of plating due to flowing conditions of the plating solution in the conventional cup type plating apparatus, a cup type plating apparatus according to the present invention in which a wafer is plated by supplying the plating solution through a liquid-supply tube provided at the center bottom of the plating tank toward the wafer mounted at the opening at the top of the plating tank, while electrically connecting an anode provided in the plating tank to the wafer connected to a cathode, and by having the target surface of plating of the mounted wafer contact the flow of the plating solution formed by supplying it upward from the liquid-supply tube through the liquid outlet channel toward outside the plating tank, is further provided with a stirring means beneath the target surface of plating of the mounted wafer for forcibly stirring the plating solution supplied to the plating tank.

Since the plating solution supplied in an upward flow steadily forms a flowing pattern of spreading from around the center of the target surface of plating toward the periphery in a conventional cup type plating apparatus, the amount of the metal ions supplied for plating tends to be different between the periphery and the center of the target surface of plating, resulting in unevenness in the property of plating between the periphery and the center, especially at higher current density. However, in this cup type plating apparatus, the direction of upward flow of plating solution supplied from the liquid supply tube is changed by means for stirring so that the target surface of plating contacts the liquid in a relatively randomly flowing condition. Therefore, the plating metal ions are uniformly supplied to the whole target surface of plating and very highly homogeneous plating can be realized. Also, since the plating solution contacts the target surface of plating forming relatively randomly flowing condition, the unevenness in the appearance of plating of the shape of flowing liquid easily formed due to certain flowing condition of the plating solution does not occur any more.

The stirring means in the present invention may be any ones that can stir plating solutions supplied in an upward flow. For example, a mixing blade with plurality of impellers may be provided and rotated beneath the target surface of plating, or pumping system may be provided to shoot out the plating solution to interfere with the upward flow of the plating solution supplied from the liquid supply tube. In short, any means may be selected that can alter flowing conditions of the plating solution at the target surface of plating caused by the upward flow of the supplied plating solution.

In a cup type plating apparatus of the present invention, the stirring means is preferably consisted of a donut-shaped disc provided with stirring blades to forcibly alter the flow of plating solution beneath the periphery of the target surface of plating and a driving system that can support said disc parallel to the target surface of plating and rotate it perpendicularly to the upward flow of the plating solution supplied from the liquid supply tube.

Thus, the plating solution supplied as an upward flow may to a certain extent reach the target surface of plating through the opening in the donut-shaped disc, and the flowing pattern of the plating solution spreading toward the periphery of the target surface of plating may be altered by the stirring blades. Therefore, the phenomenon, in which flow of the plating solution stagnate at the slight bump between the solution outlet provided beneath a wafer support and the target surface of plating of the wafer, mounted on the wafer support disappears so that homogeneous plating can be realized even at the periphery of the target surface of plating.

Stirring blades in this case may be any ones with shapes that can forcibly alter the flow of the plating solution beneath the periphery of the target surface of plating. In order to efficiently alter the flowing condition of the plating solution at the target surface of plating, these stirring blades are more preferably positioned close to the target surface of plating. Also, the shape and area of the opening in the donut-shaped disc may be determined to fit the position and the size of the liquid-supply tube of the plating solution, so that the plating solution supplied as an upward flow may to a certain extent reach the target surface of plating.

BRIEF DESCRIPTION OF THE DRAWINGS

FIG. 2 is a cross sectional view of a division wall used in the cup type plating apparatus shown in FIG. 1;

FIG. 3 is a plan view of the division wall used in the cup type plating apparatus shown in FIG. 1;

DETAILED DESCRIPTION OF THE PREFERRED EMBODIMENTS

Preferred embodiments of the present invention will be explained below.

Figure 1:
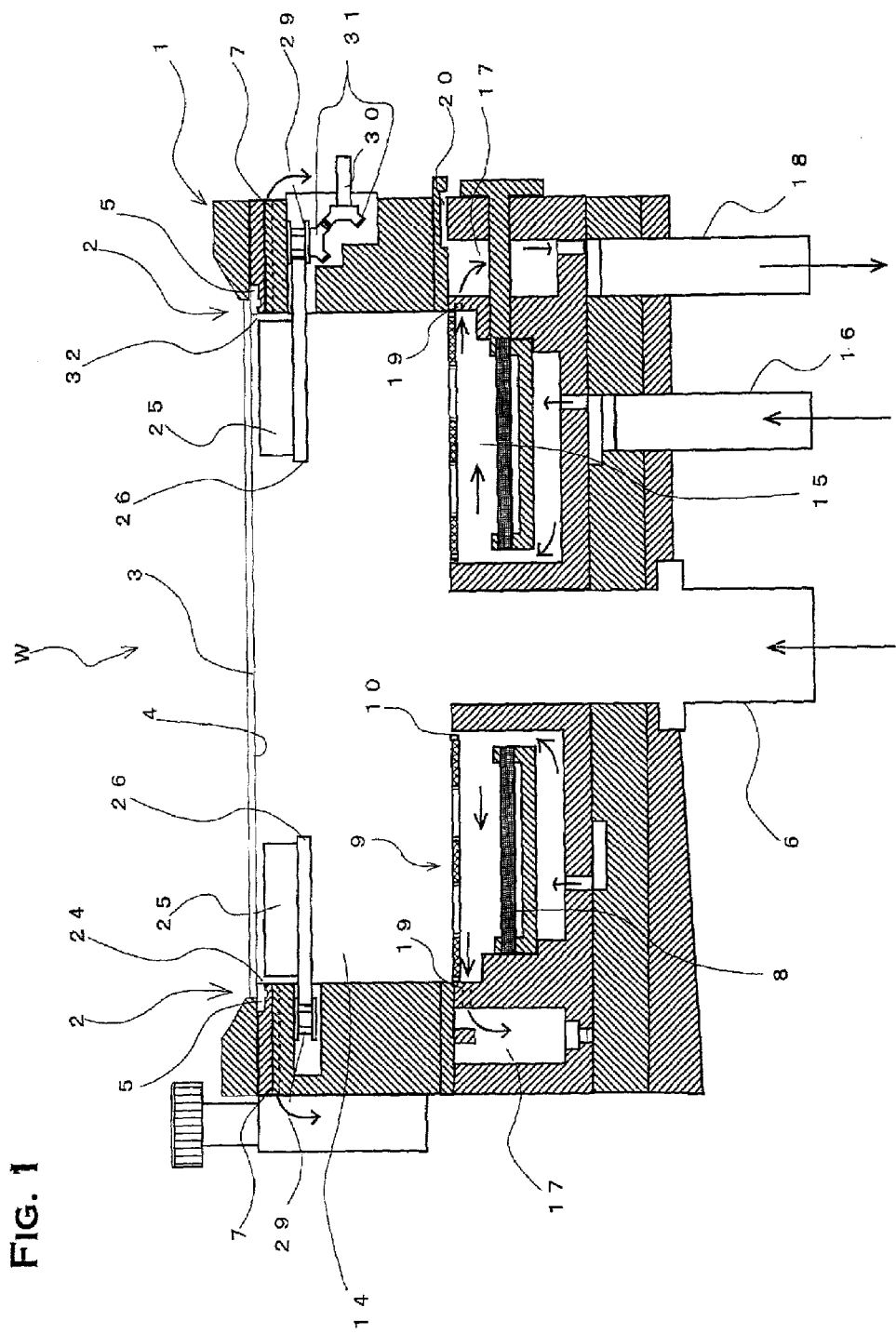
FIG. 1 is a cross sectional view of a plating tank of a cup type plating apparatus of the present invention.

FIG. 1 shows a schematic cross sectional view of a plating tank of a cup type plating apparatus of the present invention. As shown in FIG. 1 the cup type plating apparatus W of the present invention is provided with a wafer support 2 along the top opening of the plating tank 1 on which a wafer 3 is placed, and plating is carried out against the target surface of plating 4 of the wafer 3. The wafer support 2 consists of a cathode not shown and a seal packing 5 for preventing leakage of the plating solution.

Also, a main plating solution supply tube 6 is provided in the center bottom of the plating tank 1, and a main plating solution outlet 7 is provided at the top edge side for the plating solution reaching around the center of the target surface of plating 4 to overflow to the outside, forming spreading flow toward the periphery of the wafer 3. Further, a disc-shaped insoluble anode 8 formed with Pt/Ti is provided at the periphery of the main plating solution supply tube 6 in the plating tank 1.

The division wall 9 in the present invention is formed in a shape capable of separating the anode 8 from the wafer 3, or to be more precise in disc-shape corresponding to the cross sectional configuration of the plating tank 1, and is fixed in the plating tank 1 with the main plating solution supply tube 6 inserted into a liquid-supply tube receptacle 10 opened in the center of the wall as shown in FIGS. 2 and 3. In this division wall 9, many openings 11, 11 . . . are opened and diaphragm 12, 12 . . . is positioned at the openings 11, 11 . . . covering the openings 11, 11 . . . Here, said openings 11, 11 . . . are arranged at equal intervals on circles C1, C2, C3, C4, and C5 concentric with the liquid-supply tube receptacle 10. Further, this division wall 9 is provided with caps 13, 13 . . . formed to detachably fit in the openings, and optional openings can be closed by fixing the caps 13, 13 . . . Each inner surface of the openings 11, 11 . . . and outer surface of the caps 13, 13 . . . are threaded (not illustrated), so that the caps 13, 13 . . . may be screwed into the openings 11, 11 . . . in a watertight manner.

The diaphragm 12 is a porous film formed with an insulating material having chemical resistance to the plating solution, and is electrically conductive between the anode and the wafer by means of ions in the plating solution.

In the plating tank 1 are formed a wafer side separate chamber 14 above and an anode-side separate chamber 15 below, by means of a division wall 9 provided with diaphragm 12. An auxiliary plating solution supply tube 16 for supplying plating solution from the bottom of the plating tank 1 is provided in the anode-side separate chamber 15, and an auxiliary plating solution reservoir 17 for discharging the plating solution supplied to the anode-side separate chamber 15 is provided outside the anode-side separate chamber 15. And an auxiliary plating solution discharge tube 18 is provided in the auxiliary plating solution reservoir 17.

A gas outlet 19 is opened in the wall of the plating tank 1 immediately below the division wall 9 for discharging bubbles evolved at the anode 8 and gathered below the division wall 9. The tip of the gas outlet 19 is communicated with the auxiliary plating solution reservoir 17. The auxiliary plating solution reservoir 17 is provided at the top thereof with a vent port 20 to allow the gas discharged from the anode-side separate chamber 15 to be released outside.

Figure 4:
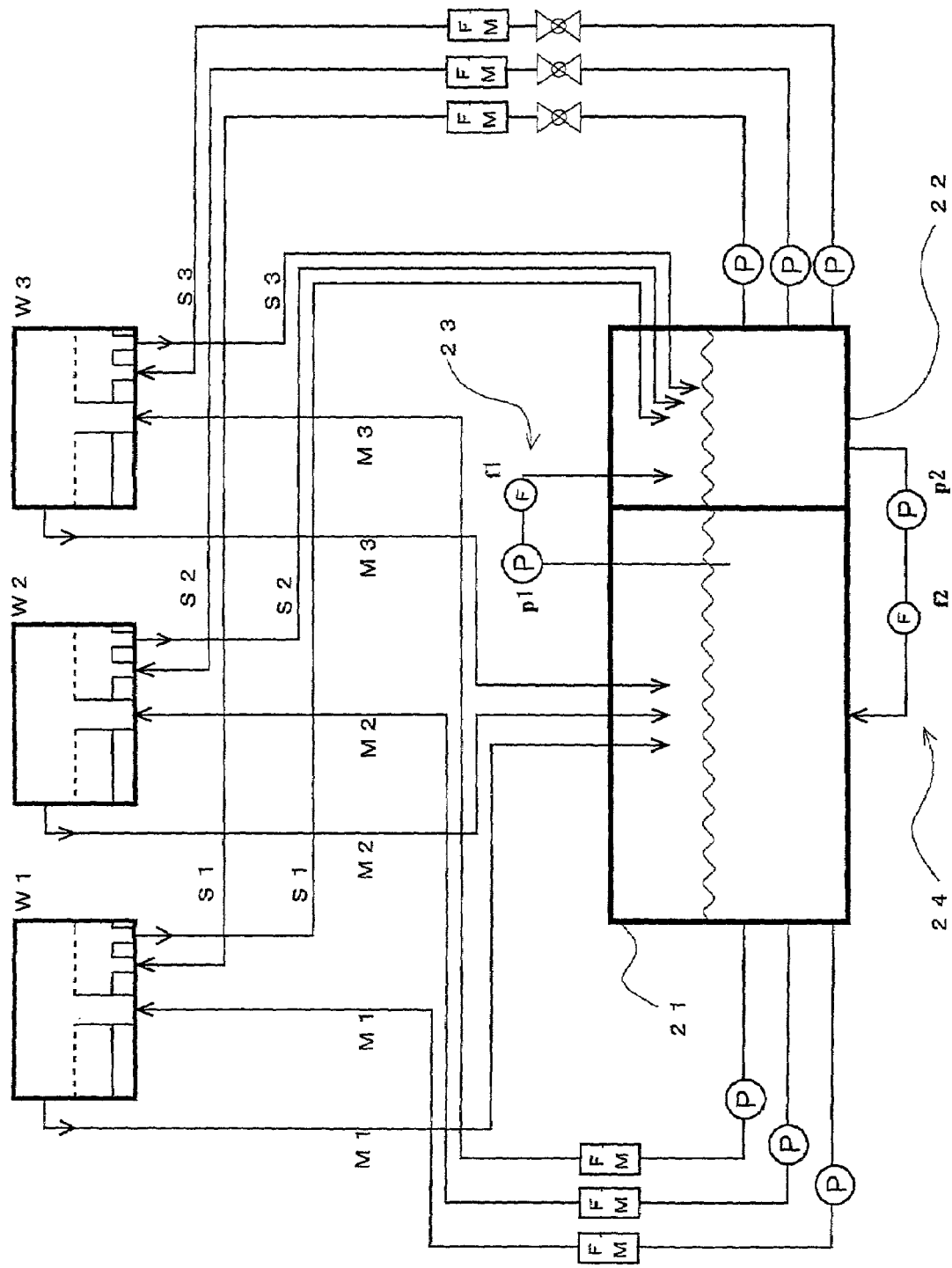
FIG. 4 is a schematic view showing circulation routes for main and auxiliary plating solutions.

FIG. 4 shows a schematic view representing circulation routes of the main and the auxiliary plating solutions. FIG. 4 shows an example where three cup type plating apparatuses W (W1, W2, W3) as shown in FIG. 1 are employed. This Embodiment describes an example of using plurality of cup type plating apparatuses, however a single cup type plating apparatus can be similarly used.

The main plating solution supply tube 6 and the main plating solution outlet 7 of each cup type plating apparatus (W1, W2, W3) are connected by tubing to the main plating solution reservoir 21, each forming a main plating solution circulation route (M1, M2, M3). Similarly the auxiliary plating solution supply tube 16 and the auxiliary plating solution outlet 18 of each cup type plating apparatus (W1, W2, W3) are connected by tubing to the auxiliary plating solution reservoir 22, each forming an auxiliary plating solution circulation route (S1, S2, S3).

The main plating solution reservoir 21 and the auxiliary plating solution reservoir 22 are respectively provided with liquid sending systems 23 and 24 consisting of filters (f1, f2) and liquid sending pumps (p1, p2) so that the plating solution in both the reservoirs can be mutually sent. The liquid sending pumps (p1, p2) are controlled to start responding to the copper concentration values detected by copper concentration sensors (not shown in the figure) fixed to the main plating solution reservoir 21 and the auxiliary plating solution reservoir 22.

The concentration of the plating solutions are adjusted as follows. For example, when plating is carried out continuously using a soluble anode, the concentration of Cu in the auxiliary plating solution reservoir 21 increases so that the liquid sending pump p2 is started following detection by the copper concentration sensor, and the plating solution in the auxiliary plating solution reservoir 22 is sent to the main plating solution reservoir 21. Cu is thus supplied to the plating solution in the main plating solution reservoir 21. When Cu concentration has significantly increased in the auxiliary plating solution reservoir, the liquid sending pump p1 is started, the plating solution of the main plating solution reservoir 21 is sent to the auxiliary plating solution reservoir 22, and the Cu concentration of the auxiliary plating solution is reduced.

Figure 5:
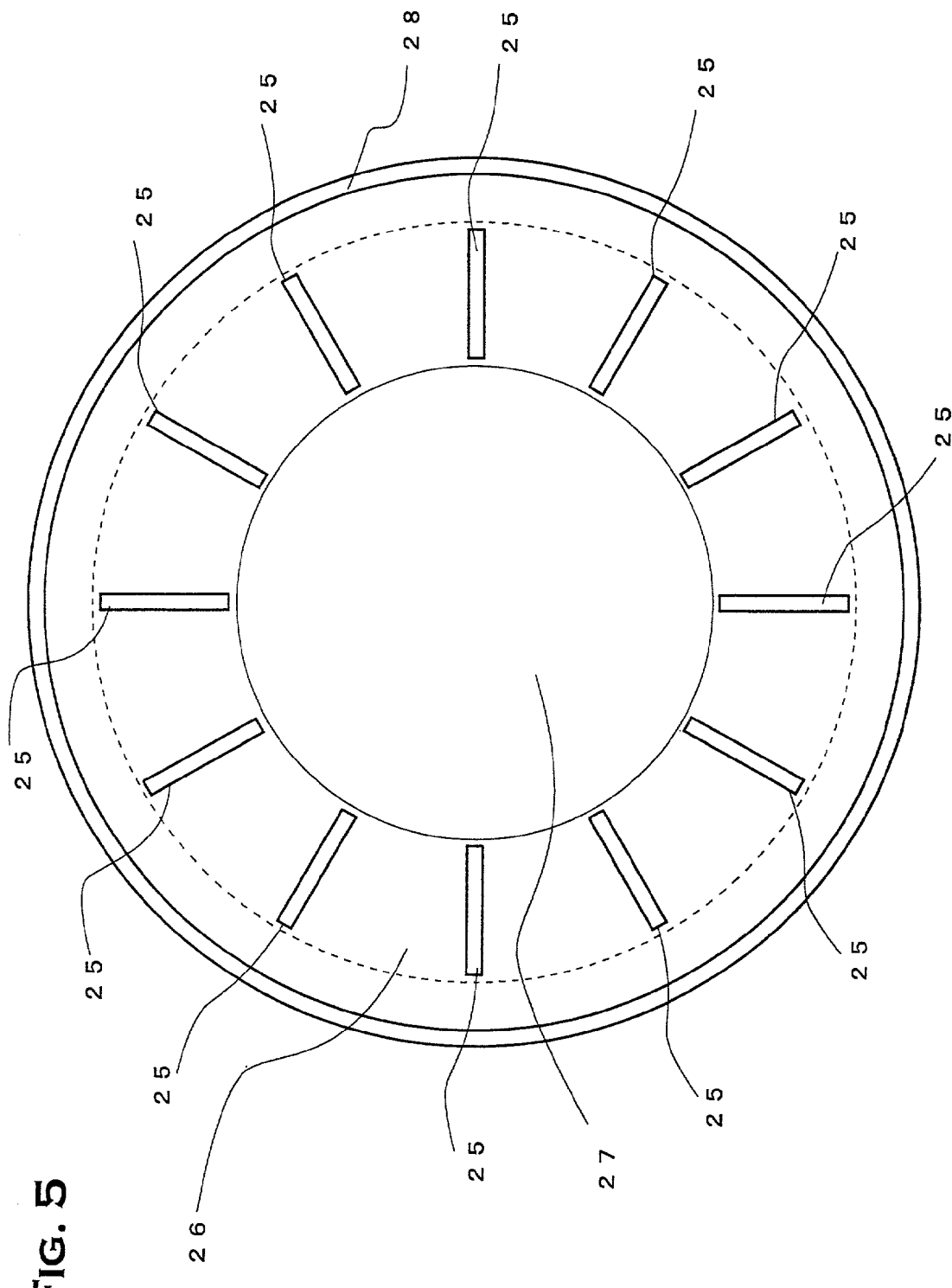
FIG. 5 is a plan view of a donut-shaped disc used in the cup type plating apparatus shown in FIG. 1.

In the wafer-side separate chamber 14, a donut-shaped disc 26 on which plurality of impellers 25 stand is placed beneath the target surface of plating 4. The impellers 25 are arranged with their top edges close to the target surface of plating 4. As the plan view in FIG. 5 shows, the donut-shaped disc 26 is provided with an opening 27 in the center thereof and a plurality of radially arranged impellers 25. A gear section 28 is provided on the peripheral side of the donut-shaped disc 26. The donut-shaped disc 26 is held by a plurality of pulleys 29 and the gear section 28 meshing with each other below the main plating solution outlet 7 so as to be parallel to the target surface of plating 4. One of the pulleys 29 is connected to a bevel gear 31 which interlocks with a drive shaft 30.

The plating solution supplied from the main plating solution supply tube 6 as an upward flow reaches the target surface of plating 4 through the opening 27 of the donut-shaped disc 26, and forms a flowing condition of the plating solution spreading toward the periphery of the target surface of plating 4. Here, the donut-shaped disc 26 rotates perpendicularly to the upward flow of the plating solution by rotating the pulley 29 through the bevel gear 31 by means of the drive shaft 30. The flowing condition of the plating solution spreading toward the periphery of the target surface of plating 4 is altered by means of the impellers 25 of this donut-shaped disc 26. Especially, the plating solution tend to stagnate around the edge 32 formed by the main plating solution outlet 7 and the target surface of plating 4, however plating solution becomes to flow sufficiently even around the edge 24 due to stirring with these impellers 25.

Since the cup type plating apparatus of the present invention described above utilizes, in place of conventional diaphragm, a division wall provided with plurality of openings covered with diaphragm, advantageous cup type plating apparatus utilizing diaphragm can be put to practical use without causing cost problem. When non-conductive caps being shaped to fit in and detachable with respect to the openings are used in combination with the division wall, cross sectional current density may become freely adjustable by electrically connecting only through optional openings, resulting in prevention of heterogeneous plating on the wafer.

Even when a soluble anode is used, the cup type plating apparatus of the present invention, in which the plating tank is separated by diaphragm to an anode-side separate chamber and a wafer-side separate chamber, each separate chamber being provided with a separate plating solution circulation channel, can respond to changes in plating solution concentration due to dissolution of the anode so that plating can be carried out stably maintaining the concentration of supplied plating solution.

Further, the cup type plating apparatus of the present invention enables more uniform plating all over target surface of plating and elimination of non-uniform plating which tends to occur at the periphery of the target surface of plating.

What is claimed is:

1. A cup type plating apparatus, comprising:
   a plating tank in which a wafer is plated with a plating solution, said plating tank having an opening at a top side of the plating tank on which the wafer to be plated is to be placed;
   a liquid-supply tube provided at a bottom center of the plating tank for supplying the plating solution to the wafer;
   an anode provided in the plating tank;
   a cathode connected to the wafer; and
   stirring means beneath a target surface of the wafer for forcibly stirring the plating solution supplied into the plating tank to form a liquid-flow channel in the plating solution in an upward flow from said liquid-supply tube, and the plating solution contacts said target surface of plating of said wafer to complete plating.

2. The cup type plating apparatus according to claim 1, wherein said means for stirring comprises:
   a donut-shaped disc provided with stirring blades for forcibly altering the flow of plating solution around and beneath the periphery of the target surface of plating; and
   a driving mechanism capable of holding said disc parallel to the target surface of plating and rotating said disc perpendicularly to the upward flow of the plating solution supplied from the liquid-supply tube.

3. A cup type plating apparatus, comprising:
   a plating tank in which a wafer is plated by a plating solution, said plating tank having an opening at a top side of the plating tank on which the wafer to be plated is to be placed;
   a liquid-supply means for supplying the plating solution to the wafer;
   an anode provided in the plating tank;
   a cathode connected to the wafer; and
   means for stirring the plating solution beneath a target surface of the wafer to form a liquid-flow channel in an upward flow from said liquid-supply means such that the plating solution contacts said target surface of said wafer to complete plating.

4. The cup type plating apparatus according to claim 2, wherein said means for stirring comprises:
   a donut-shaped disc provided with stirring blades for forcibly altering the flow of plating solution around beneath the periphery of the target surface of plating; and
   a driving mechanism capable of holding said disc parallel to the target surface of plating and rotating perpendicularly to the upward flow of the plating solution supplied from the liquid-supply means.

* * * * *